US005681219A

United States Patent [19]

LeFevre et al.

[11] Patent Number: 5,681,219

[45] Date of Patent: Oct. 28, 1997

[54] EXHAUST SHROUD AND SKIRT APPARATUS AND METHOD

[75] Inventors: Gregg S. LeFevre; Darrell A. Harris, both of Austin, Tex.

[73] Assignee: Advanced Micro Devices, Sunnyvale, Calif.

[21] Appl. No.: 412,538

[22] Filed: Mar. 28, 1995

[51] Int. Cl.⁶ .................................................. H05K 7/20
[52] U.S. Cl. .......................................... 454/187; 454/184
[58] Field of Search ..................................... 454/187, 184; 361/345, 678, 691, 696

[56] References Cited

FOREIGN PATENT DOCUMENTS

| 2 133 958 | 1/1973 | Germany | 454/345 |
|---|---|---|---|
| 61-24933 | 2/1986 | Japan | 454/187 |
| 62-194121 | 8/1987 | Japan | 454/187 |
| 62-194142 | 8/1987 | Japan | 454/187 |
| 2-150656 | 6/1990 | Japan | 454/187 |

*Primary Examiner*—Harold Joyce
*Attorney, Agent, or Firm*—Merchant, Gould Smith, Edell, Welter & Schmidt, P.A.

[57] ABSTRACT

An apparatus and method for removing particles and reducing temperature within an equipment unit, such as a photolithography stepper unit. The equipment unit is located in a clean room environment. The clean room environment contains environmental gases and is defined by four walls, a floor, and a ceiling. At least one of the four walls is hollow forming an air chase. Outside air is circulated in the air chase. A hole in the wall containing the air chase allows communication between the clean room environment and the air chase. A skirt is connected to the equipment unit and the floor, and a shroud is connected to the skirt, the floor, and the hole. The skirt and the shroud substantially seal the equipment unit with the hole to allow environmental gases within the equipment unit to be drawn within the equipment unit to the air chase.

14 Claims, 6 Drawing Sheets

5,681,219

EXHAUST SHROUD AND SKIRT APPARATUS AND METHOD

BACKGROUND OF THE INVENTION

1. Field of the Invention

The invention relates generally to clean room manufacture of, for example, semiconductor chips, and, more particularly, relates to an apparatus and method for vacuum air flow for heat reduction and particle contamination avoidance in a clean room manufacturing environment.

2. Description of the Related Art

A wide spectrum of so-called "clean room" manufacturing practices are known in the art. In a typical clean room manufacturing process, measures are taken to limit the extent of particulate and extraneous environmental material contamination and inaccuracies therefrom that are possible during the manufacturing steps. The measures can include limiting human contact, filtering and purification of air and other gases, enclosing equipment for process procedures, and others.

A particular application of clean room manufacturing practices is the manufacture of semiconductor chips. A semiconductor chip is an integrated circuit formed of semiconductor materials. Such a chip may be designed to have specified electrical characteristics for performing calculative and manipulative operations when incorporated in an electronics device.

Semiconductors are various solid crystalline substances, such as, for example, silicon, that have electrical conductivity greater than insulators but less than good conductors. By chosen inter-layering of semiconductors and insulators in desired pathway and topographical configurations, semiconductors and insulators can form a semiconductor chip, such as, for example, a microprocessor or a digital signal processor, which is capable of performing select electrical algorithmic operations.

When forming semiconductor devices, such as chips, very small scale, but, yet, precise tolerance, is often sought. This is the case, at least in part, because of economic, spatial, and accuracy considerations with respect to these devices. As might well be expected, when small scale and precise tolerance are necessary, process variables and environmental variables can greatly affect the precision of manufacture.

An example of a process variable which may affect precision in the manufacture of semiconductor devices is temperature. At various steps in the semiconductor manufacture process, particular temperatures may be critical. For example, lasers and other lighting and selectively designed optics are often employed in semiconductor device manufacture. Lasers and optics may be affected by temperatures. Warmer temperatures can result in rising hot gas vapors, like that which results on a hot parking lot. When select optics are necessary in such an environment, optics (and, thus, focus) may be distorted by the rising vapors. Obviously, distortion of select optics during semiconductor manufacture can significantly impede efforts directed at precision when small scale is involved and important. It would, therefore, be an improvement to remove or otherwise reduce the effects of rising warm vapors during semiconductor manufacture steps requiring select optics and lighting and small scale accuracy.

In addition to process variables, environmental variables may affect precision in the manufacture of semiconductor devices. An example of an environmental variable is extraneous environmental- and process-created particulates. Accuracy of the semiconductor manufacturing process is affected by the presence of such particulates. For example, particulates may short conductive pathways of semiconductor devices and/or may disfigure desired semiconductor and insulator topographies. In semiconductor device manufacture, therefore, it is desirable to limit the presence of extraneous particulates. Extraneous particulates may result from presence of particulates in the environment, for example, the clean room air, and/or from equipment employed in the manufacture steps, for example, particles from frictional rub-off of materials or coatings, such as silicon or rubber, or from process chemical by-products, such as dust from photoresist. Air flows presented in the semiconductor manufacturing process, such as upward flows of warm gas vapors, may exacerbate the effects of the presence of particulates because such flows may carry particulates to other locations. It would, thus, be an improvement in the art to further limit the presence of extraneous environmental and process particulates during steps of the semiconductor device manufacture process, for example, by limiting air flow movement of such particulates and otherwise.

The present invention helps to remedy these problems of temperature, rising hot vapors, and particulates in the semiconductor device manufacture process and others. In doing so, the present invention does not create other problematic conditions for those processes. Other problematic conditions might include, for example, conditions of equipment malfunction or deviation because of incidentally created electromotive forces (EMF). This could be the case, for example, if a fan (or other electronically driven equipment) were employed for convective heat dissipation. These other problematic conditions might also include, for example, varying temperatures within process equipment during periods of operation and shut-down. It is known to be the case, for example, that during a period of warm-up of process equipment, such as after equipment is opened for maintenance and then closed to begin warm-up for operation, temperatures may significantly vary from optimum.

The present invention helps remedy the problems of temperature-induced distortion, rising vapors, and extraneous particles in the semiconductor device clean room manufacture process, and, in doing so, does not create other problematic conditions. In fact, the present invention results in several incidental advantages, such as no additional EMF creation and increased consistency of temperatures at start-up and throughout operation. As is therefore apparent, the present invention, thus, provides significant advance and improvement in the prior technology and art.

SUMMARY OF THE INVENTION

To overcome the aforementioned problems, an embodiment of the present invention is a method of reducing temperature in a clean room environment. The method comprises the step of drawing environmental gases from within the clean room environment to outside the clean room environment.

In another aspect, the method further comprises the steps of circulating air outside the clean room environment and connecting the clean room environment to the air outside to create a pressure differential between the clean room environment and the air outside to cause the environmental gases from within the clean room environment to be drawn outside the clean room environment.

In yet another aspect, the environmental gases are contained within an equipment unit located within the clean room environment and the environmental gases are drawn through a passageway connected between the equipment unit and outside of the clean room environment.

In a further aspect, the step of connecting includes the step of sealing the clean room environment with the air outside.

In yet a further aspect, the step of circulating air is performed within an air chase formed in a wall and the step of connecting is accomplished via a hole within the wall to allow communication of the air chase with the clean room environment.

In even a further aspect, the passageway is formed of a skirt and a shroud, which together serve to seal the environmental gases with the air outside.

Another embodiment of the invention is a method of removing particles from a clean room environment. The method comprises the step of selectively drawing environmental gases containing the particles.

In another aspect, the step of drawing causes a reduction of temperature in the clean room environment.

In yet another aspect, the method further comprises the steps of circulating air outside the clean room environment and connecting the clean room environment to the air outside to create a pressure differential between the clean room environment and the air outside to cause the environmental gases containing the particles to be drawn.

In another aspect, the environmental gases are contained within an equipment unit located within the clean room environment and the environmental gases are drown via a passageway connected between the equipment unit and outside of the clean room environment.

In a further aspect, the step of connecting includes the step of sealing the clean room environment with the air outside.

In yet a further aspect, the step of circulating air is performed within an air chase formed in a wall and the step of connecting is accomplished via a hole within the wall to allow communication of the air chase with the clean room environment.

In even a further aspect, the passageway is formed of a skirt and a shroud, which together serve to seal the environmental gases with the air outside.

Yet another embodiment of the invention is an apparatus for reducing temperature in a clean room environment. The apparatus comprises a draw passage for flow of environmental gases from within the clean room environment to outside the clean room environment.

In another aspect, the draw passage also provides for removal of particles contained within the environmental gases.

In yet another aspect, the draw passage is connected between an equipment unit containing the environmental gases, the equipment unit located within the clean room environment, and air circulated outside the clean room environment.

In a further aspect, the apparatus further comprises an air chase for containing the air circulated outside the clean room environment.

In an even further aspect, the draw passage comprises a skirt and a shroud, for sealing the equipment unit and drawing the environmental gases outside the clean room environment.

Another embodiment of the invention is an apparatus for removing particles from a clean room environment. The apparatus comprises a draw passage for flow of environmental gases containing the particles from within the clean room environment.

In another aspect, the draw passage also provides for temperature reduction in the clean room environment.

In yet another aspect, the draw passage is connected between an equipment unit containing the environmental gases and the particles, the equipment unit located within the clean room environment, and air circulated outside the clean room environment.

In even a further aspect, the apparatus further comprises an air chase for containing the air circulated outside the clean room environment.

In another aspect, the draw passage comprises a skirt and a shroud, for sealing the equipment unit and drawing the environmental gases containing the particles.

Even another embodiment of the invention is an apparatus for reducing temperature of an equipment unit located in a clean room environment containing environmental gases. The clean room environment is defined by four walls, a floor, and a ceiling, at least one of the four walls being hollow to form an air chase in which outside air is circulated and having a hole allowing communication between the clean room environment and the air chase. The apparatus comprises a skirt connected to the equipment unit and the floor and a shroud connected to the skirt, the floor, and the hole.

In another aspect, the skirt and the shroud substantially seal the equipment unit with the hole to allow environmental gases within the equipment unit to be drawn from within the equipment unit into the air chase.

Another embodiment of the invention is an apparatus for removing particles within an equipment unit located in a clean room environment containing environmental gases. The clean room environment is defined by four walls, a floor, and a ceiling, at least one of the four walls being hollow to form an air chase in which outside air is circulated and having a hole allowing communication between the clean room environment and the air chase. The apparatus comprises a skirt connected to the equipment unit and the floor and a shroud connected to the skirt, the floor, and the hole.

In another aspect, the skirt and the shroud substantially seal the equipment unit with the hole to allow environmental gases within the equipment unit to be drawn from within the equipment unit into the air chase.

In yet another aspect, the apparatus serves also to reduce temperature within the equipment unit.

In a further aspect, the apparatus comprises vents incorporated in the skirt for regulating the environmental gases drawn from within the equipment unit into the air chase.

In another aspect, the apparatus further comprises cord slots incorporated in the shroud for passage of operational cords of the equipment unit from within the shroud to outside the shroud.

BRIEF DESCRIPTION OF THE DRAWINGS

For a more complete understanding of the present invention and for further objects and advantages thereof, reference may now be had to the following description in conjunction with the accompanying drawings, in which.

DETAILED DESCRIPTION

Figure 1:
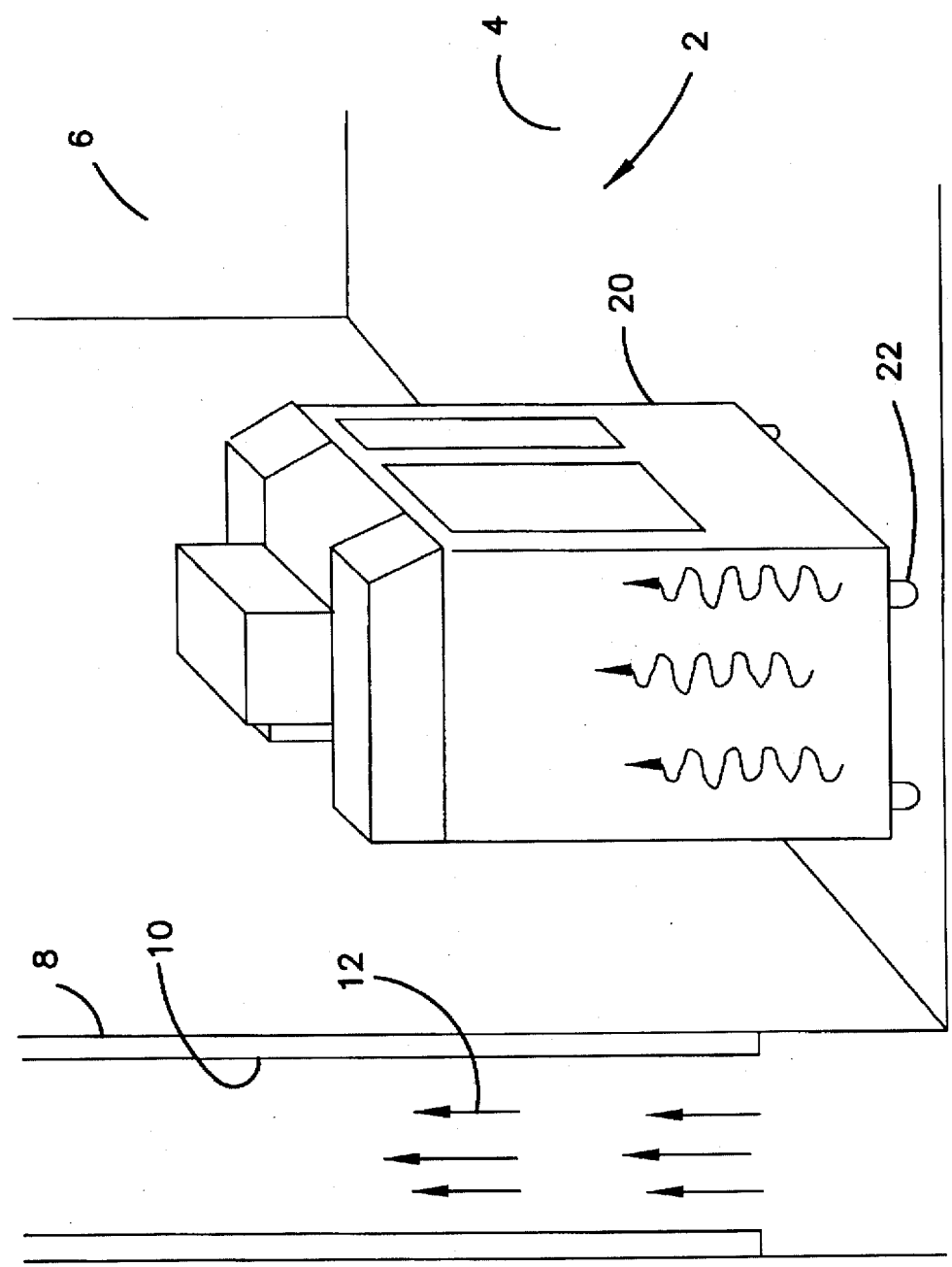
FIG. 1 is a perspective view of a prior typical clean room for semiconductor device manufacture, in which is situated a photolithography stepper unit, and a cross sectional view through a prior hollow wall of the clean room, which hollow wall incorporates an air chase.

Referring first to FIG. 1, a typical clean room 2 of the prior art, such as that employed in semiconductor device manufacture, is shown. The clean room 2 includes a floor 4 enclosed by walls (for exemplary purposes, only two of the walls, typical wall 6 and hollow wall 8, are shown in FIG. 1) and a ceiling (not shown in FIG. 1). Hollow wall 8 includes an air chase 10 formed within the hollow structure. Circulated air 12 flows upward within the air chase 10 of the hollow wall 8. As used herein, the terms "clean room environment" are used to refer both, according to the context, to a typical clean room 2 in its entirety and to any portion of such a room 2, including, without limitation, internal spaces within equipment located in such a room 2.

Still referring to FIG. 1, within the clean room 2 is contained a photolithography stepper unit 20 which sits atop the floor 4 on base legs 22. The photolithography stepper unit 20 is a tool employed to expose silicon wafers during manufacture of semiconductor devices. In the unit 20, silicon wafers superimposed with photoresist patterned to form a desired electrical circuit configuration are exposed to lighting. Various steps of moving the wafers and subjecting the wafers to light, for example, including focused lighting and laser beams, may occur within the photolithography stepper unit 20. During this operation of the unit 20, heat may be generated and particles may be present from the external environment of the unit 20 or due to internal frictional generation, chemical by-products, or otherwise. This heat and these particles may each present problems in the manufacturing process being undertaken in the clean room 2, for example, the problems previously described herein in connection with the semiconductor manufacturing process and others. Although the drawings and discussion herein reference a photolithography stepper unit 20 in a clean room 2 manufacturing environment, the present invention has application in other circumstances and with other equipment in which heat, gas vapors, and/or particles may prove problematic.

Figure 2:
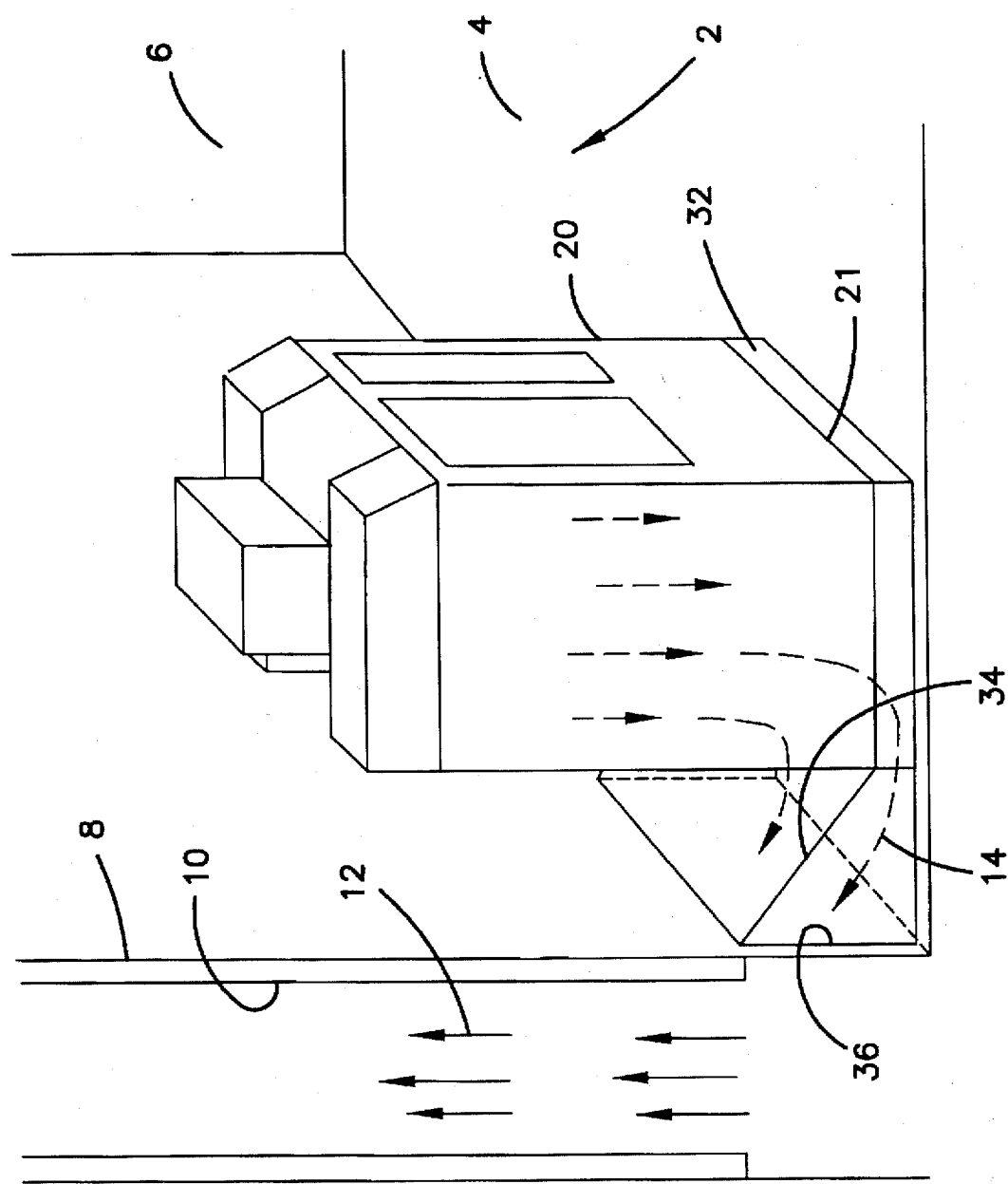
FIG. 2 is a perspective view and cross-sectional view, each substantially identical to those of FIG. 1, illustrating an exhaust shroud and skirt of the present invention in operation in conjunction with the photolithography stepper unit, and the air chase for drawn air operation.

Next referring to FIG. 2, an embodiment of the present invention may be understood. In the embodiment, a skirt 32 and shroud 34 are employed to seal the photolithography stepper unit 20 with the floor 4 and the hollow wall 8 of the clean room 2, respectively. In the embodiment, the hollow wall 8 includes a chase opening 36. The chase opening 36 allows communication between the air chase 10 and the clean room 4. The chase opening 36 may be covered by the shroud 34 so that, within the skirt 32 and shroud 34, air 14 is drawn by negative pressure created by the circulated air 12 in the air chase 10. This drawn air 14, which, for example, may include rising warm gas vapors with the photolithography stepper unit can remove particles and draw heat from within the unit 20. In this manner, heat and particles are reduced to help alleviate problems in the manufacture process involving the stepper unit 20.

Still referring to FIG. 2 for more detail, the skirt 32 in the embodiment fits along the base 21 of the stepper unit 20 between the unit 20 at the base 21 and the floor 4. The skirt 32 may substantially or only partially enclose (or seal) the area between the unit 20 at the base 21 and the floor 4. In one application with a photolithography stepper unit 20 that is substantially square (i.e., has four vertical walls, a top, and a bottom), the skirt 32 may enclose the area between the unit 20 at the base 21 and the floor 4 along three sides of the unit, leaving the fourth side enclosed.

Still referring to FIG. 2, in the embodiment, a shroud 34 connects with the unit 20 at the base 21 to seal the unit 20 with the floor 4 (by virtue of the skirt 32) and the chase opening 36. In the embodiment, the chase opening 36 is larger than the cross-sectional area unenclosed by the skirt 32. In order to seal the unit at the base 21 with the floor 4 and chase opening 36, the shroud 34 may have substantially triangular sides and a slanted top. It is to be understood, nonetheless, that the shroud 34 and skirt 32 could, alternatively, be configured and designed in a variety of manners. In fact, variation of configuration and design can allow optimization of the concept. All alternative configurations and designs are included in the invention, as they can each afford the same objects and advantages and perform the desired sealing of the stepper unit with the air chase 10 in a manner that allows drawn air 14 to be drawn within and/or from the unit 20 for removal of heat (and resulting warm gas vapors) and particles (carried by the vapors or otherwise present).

Figure 3:
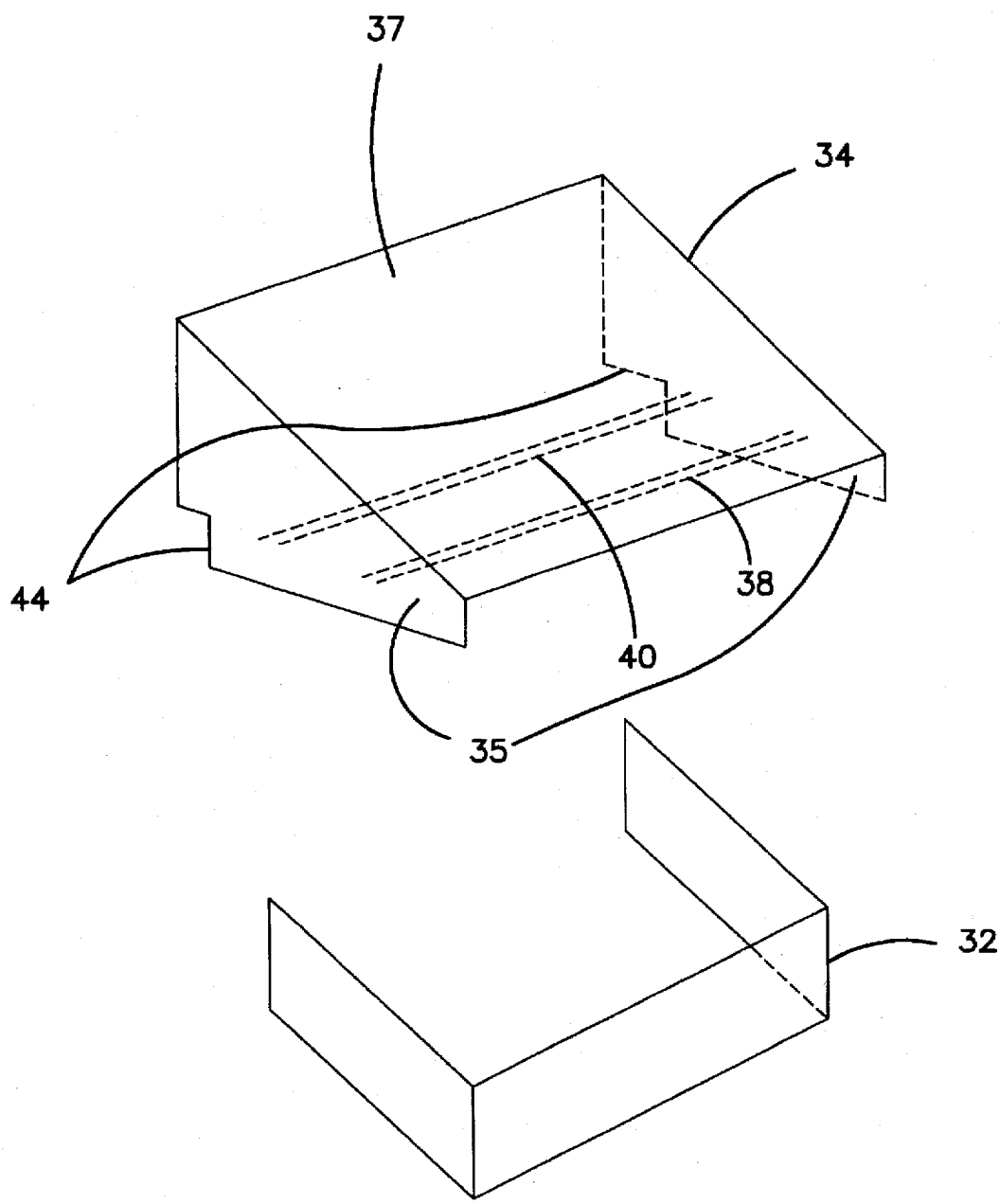
FIG. 3 is a perspective view of an embodiment of the exhaust shroud and skirt of the present invention.

Next referring to FIG. 3, a detailed illustration of 10 an embodiment of the shroud 34 and skirt 32 is shown. In this embodiment, the skirt 32 is comprised of three panels of substantially uniform width. The panels are configured to, in effect, form three sides of a square. As shown in FIG. 2, such a skirt 32 may fit between a photolithography stepper unit 20 (shown in FIG. 2) at its base 21 and the floor 4 (shown in FIG. 2) of a clean room. Also in this embodiment, the shroud 34 comprises a three sided object formed of end pieces 35 and a top piece 37. The end pieces 35 may be substantially triangular. Such a configuration allows for sealing of a larger chase opening 36 (shown in FIG. 2) with a more narrow area between a stepper unit 20 and floor 4. The shroud 34 configuration may also include cord slots 44, for example, in one or both of the end pieces 35 or otherwise. It may also be desirable to provide the shroud 34 with various support braces, such as a fore brace 38 and a back brace 40, or other arrangement. As will be apparent, a variety of other configurations are possible. All are included in the invention.

Still referring to FIG. 3, manufacture and materials of the shroud 34 and skirt 32 may be described. The shroud 34 and skirt 32 may be formed of a variety of materials. Substantially rigid materials, such as polypropylene, aluminum, wood, or other, are suitable, although other materials with other characteristics may also be satisfactory. The shroud 34 and skirt 32 may likewise be manufactured by a variety of methods. For example, if polypropylene material is utilized, the parts may be cut and cemented or welded together; alternatively, the parts could be injection molded, bent, or otherwise formed. As those skilled in the art will appreciate, a variety of materials and manufacture may be employed in keeping with the concepts of the present invention.

Figure 4:
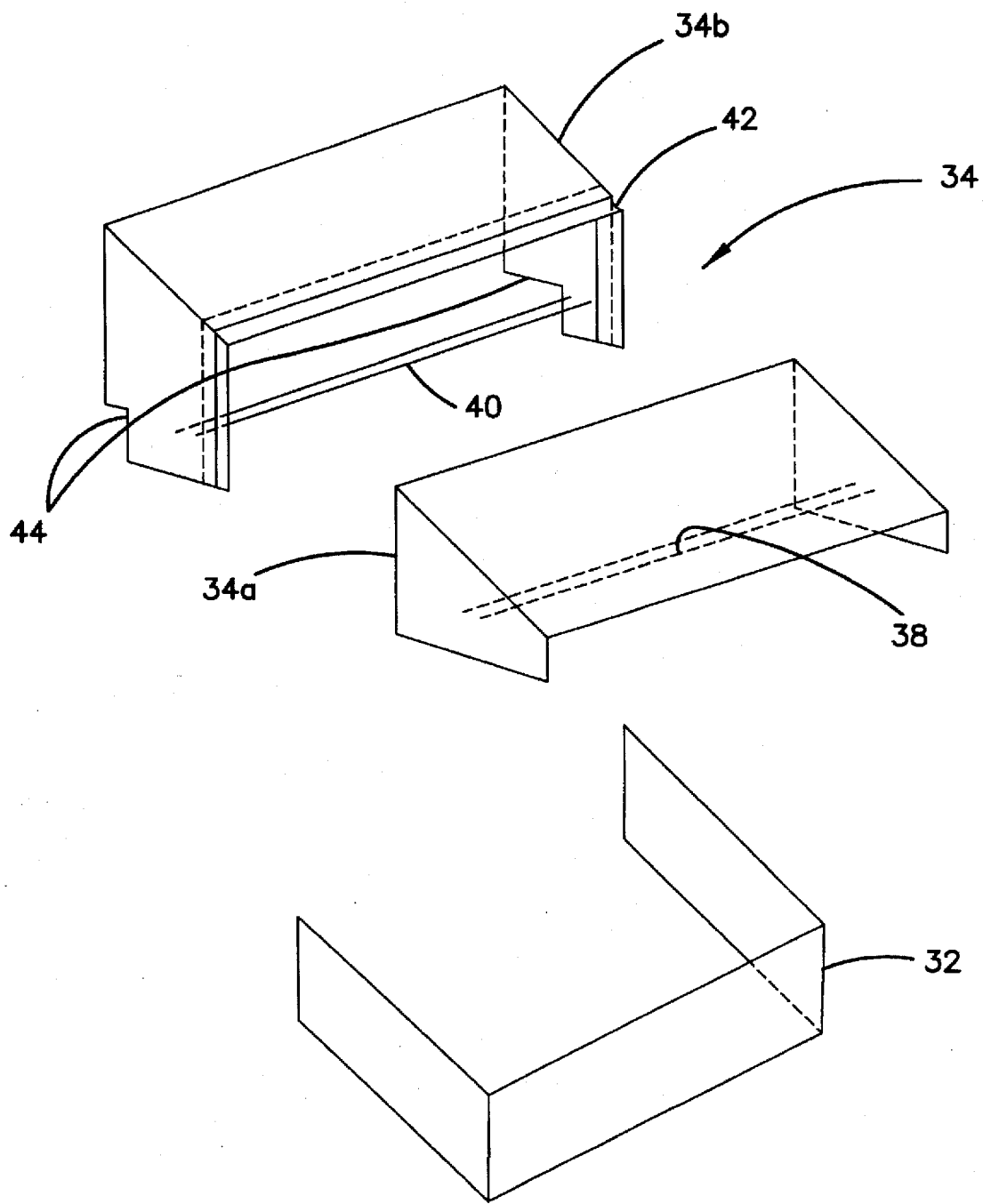
FIG. 4 is a perspective view of an alternative embodiment of the exhaust shroud and skirt of the present invention.

Now referring to FIG. 4, an alternative embodiment of the shroud 34 and skirt 32 of the invention is shown. In this alternative, the shroud 34 is comprised of two unsecured parts, a fore shroud 34a and a back shroud 34b. Configuration and design of the fore shroud 34a and back shroud 34b, in conjunction, are substantially similar to that of the embodiment of FIG. 3. One difference, however, is that the back shroud 34b may be equipped with a fitting lip 42 to seal the back shroud 34b with the fore shroud 34a, and, thus, the photolithography stepper unit 20 (shown in FIG. 2) with the air chase opening 36 (shown in FIG. 2). The shroud 34 may also be equipped with braces 38,40 and may have cord slots 44.

Figure 5:
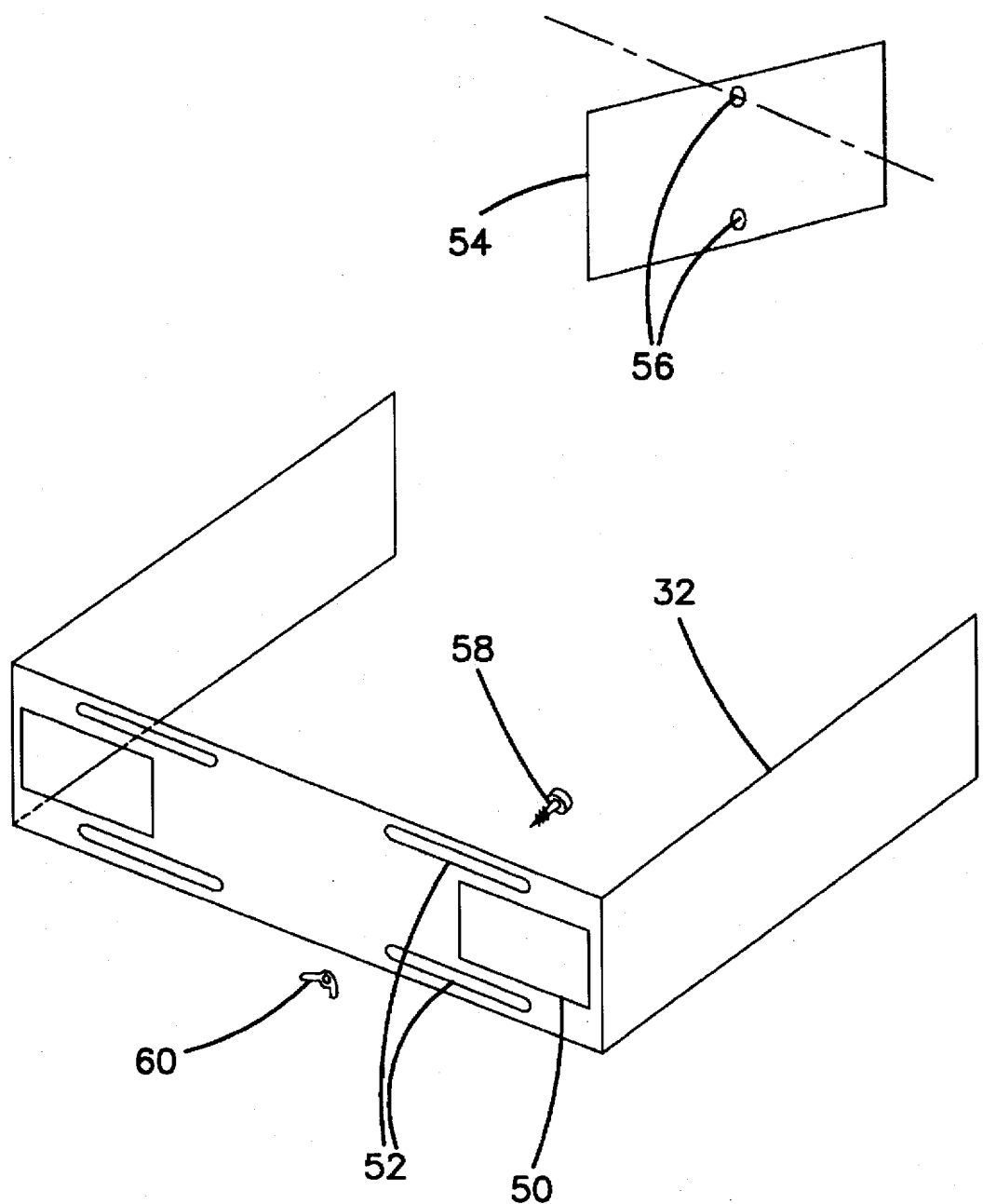
FIG. 5 is a perspective, exploded view of an alternative embodiment of the exhaust skirt of the present invention, having air regulation vents.

Next referring to FIG. 5, an alternative embodiment of a skirt 32 is shown. This skirt 32 is similar to that of other embodiments, however, the skirt 32 includes one or more vent holes 50. The purpose of the vent holes 50 is to allow regulation of the drawn air 14 (shown in FIG. 2) during operation. Regulation of the drawn air 14 may be desirable, for example, to optimize process conditions of temperature and particulates or for other reasons. The vent holes 50 may be equipped with a vent door 54 to vary the size of the holes 50 to vary drawn air 14 flows. One arrangement of vent hole 50 and vent door 54 includes adjustment slots 52 at the periphery of the vent hole 50. A vent door 54 may be equipped with adjustment screw holes 56 to align with the adjustment slots 52. Screws 58 and wing nuts 60, for example, can be employed to maintain the vent door 54 open or closed, as desired.

Figure 6:
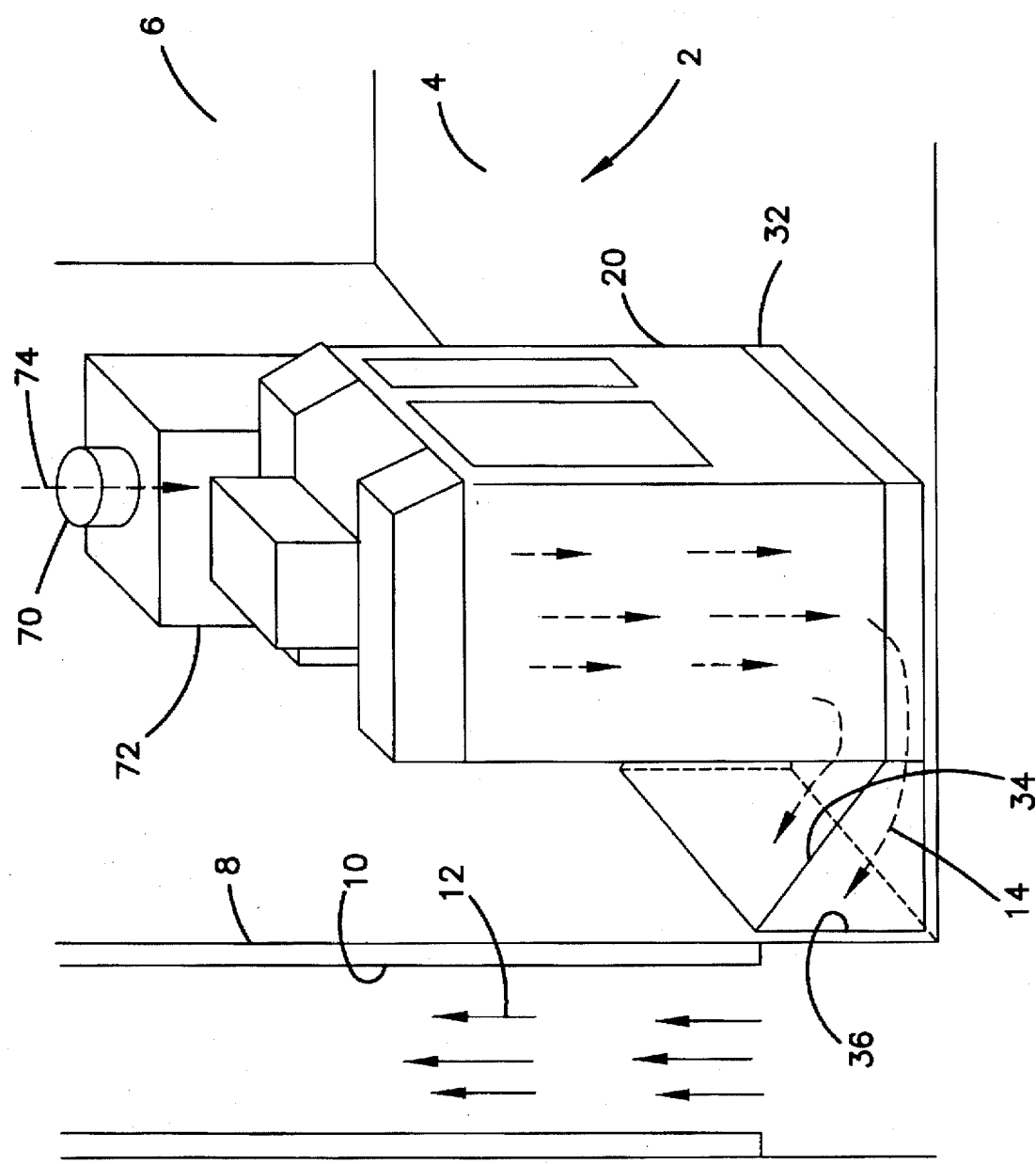
FIG. 6 is a perspective view and cross-sectional view, each substantially identical to that of FIG. 1, illustrating an alternative embodiment of the exhaust shroud and skirt of the present invention in operation in conjunction with the photolithography stepper unit and the air chase, including a blower fan and housing, for drawn and blown air operation.

Referring now to FIG. 6, another embodiment of the invention allows cooperation of a blower fan 70 with the invention. In the embodiment, a fan 70, contained in an enclosed housing 72, may force blown air 74 into a photolithography stepper unit 20. The blown air 74 may then be drawn from the unit 20 by means of the skirt 32 and shroud 36 arrangement of the present invention and the vacuum effect resulting from the circulated air 12 in the air chase 10. Numerous other configurations and variations of air blowing and drawing may be employed to achieve desired objectives and optimum results. All such configurations and variations are within the concept and scope of the invention.

As is clearly seen, the present invention helps to overcome problems of heat and extraneous particles in clean room operations. Notwithstanding that the description herein makes reference to a clean room and equipment useable in semiconductor device manufacture, the invention and the various embodiments have varied and other application. Further, the present invention is believed to be especially effective when configured and employed as described herein, however, those skilled in the art will readily recognize that numerous variations and substitutions may be made in the invention and its use and configuration to achieve substantially the same results as achieved by the embodiments and, in particular, the preferred embodiment, described herein. Each of those variations is intended to be included in the description herein and forms a part of the present invention. The foregoing detailed description is, thus, to be clearly understood as being given by way of illustration and example only, the spirit and scope of the present invention being limited solely by the appended claims.

What is claimed is:

1. A method of reducing temperature in a clean room environment having at least three walls, the method comprising the step of drawing environmental gases from within the clean room environment, through a passageway connected between an equipment unit and an air chase, the air chase being formed in a wall and located outside of the clean room environment, and the environmental gases passing through the equipment unit located within the clean room environment.

2. The method of claim 1, wherein the step of connecting is accomplished via a hole within a wall to allow communication of the air chase with the clean room environment, and includes the step of sealing the clean room environment from the air outside.

3. The method of claim 2, further comprising a step of circulating air within the air chase.

4. The method of claim 1, further comprising a step of circulating air within the air chase.

5. The method of claim 1, wherein said passageway is formed of a skirt and a shroud, which together serve to seal said environmental gases with said air outside.

6. A method of removing particles from a clean room environment, comprising the step of selectively drawing environmental gases containing undesirable particles, circulating the environmental gases outside the clean room environment through a passageway, connecting the clean room environment to the air outside, and creating a pressure differential between the clean room environment and the air outside to cause the environmental gases containing the particles to be drawn.

7. The method of claim 6, further comprising a step of sealing the clean room environment from the air outside.

8. The method of claim 6, wherein said step of circulating air is performed within an air chase formed in a wall and said step of connecting is accomplished via a hole within said wall to allow communication of said air chase with said clean room environment.

9. The method of claim 6, wherein said passageway is formed of a skirt and a shroud, which together serve to seal said environmental gases with said air outside.

10. An apparatus for reducing heat in a clean room environment, said clean room environment including an equipment unit containing environmental gases, comprising: a blower and a draw passage, the blower being located upstream of said draw passage and adjacent said equipment unit, said draw passage providing for flow of said environmental gases and for removal of heat generated by said equipment unit within said clean room environment to air outside the clean room environment;

wherein said draw passage is connected between said equipment unit containing said environmental gases and said air outside said clean room environment;

wherein said draw passage comprises a skirt and a shroud, for sealing said equipment unit and drawing said environmental gases outside said clean room environment.

11. An apparatus for removing particles from a clean room environment, said clean room environment including an equipment unit containing environmental gases, comprising: a draw passage for flow of said environmental gases containing said particles from within said clean room environment, said draw passage further providing for temperature reduction in said clean room environment by providing for the removal of heat generated by said equipment unit to air outside said clean room environment;

wherein said draw passage is connected between said equipment unit containing said environmental gases and said particles, and said air outside said clean room environment;

wherein said particles are circulated to outside said clean room environment through said draw passage;

wherein said draw passage comprises a skirt and a shroud, for sealing said equipment unit and for drawing said environmental gases containing said particles.

12. An apparatus for reducing temperature in a clean room environment containing environmental gases, the clean room environment being defined by at least three walls, a floor, and a ceiling, at least one of the walls being hollow to form an air chase in which outside air is circulated and having a hole allowing communication between the clean room environment and the air chase, the apparatus comprising:

a skirt connected to an equipment unit and the floor; and a shroud connected to the skirt, the floor, and the hole, the skirt and the shroud substantially sealing the equipment unit with the hole to allow heated environmental gases within the clean room environment to be drawn through the equipment unit into the air chase.

13. An apparatus for removing particles located in a clean room environment containing environmental gases, the clean room environment being defined by at least three walls, a floor, and a ceiling, at least one of the walls being hollow to form an air chase in which outside air is circulated and having a hole allowing communication between the clean room environment and the air chase, the apparatus comprising:

a skirt connected to an equipment unit and the floor; and a shroud connected to the skirt, the floor, and the hole, the skirt and the shroud substantially sealing the equipment unit with the hole to allow the particles within the equipment unit to be drawn from within the equipment unit into the air chase.

14. The apparatus of claim 13, wherein the apparatus draws heat generated by the equipment unit out of the clean room environment, thus reducing the temperature within the equipment unit.

* * * * *

UNITED STATES PATENT AND TRADEMARK OFFICE
CERTIFICATE OF CORRECTION

PATENT NO. : 5,681,219
DATED : October 28, 1997
INVENTOR(S) : LeFevre et al.

It is certified that error appears in the above-identified patent and that said Letters Patent is hereby corrected as shown below:

Title page,
Item [56], References Cited, FOREIGN PATENT DOCUMENTS, the number of the third foreign reference cited should read, -- 62-194141 --.

Signed and Sealed this

Seventh Day of May, 2002

Attest:

JAMES E. ROGAN
Attesting Officer
Director of the United States Patent and Trademark Office